(12) United States Patent
Matsumura et al.

(10) Patent No.: US 7,018,718 B2
(45) Date of Patent: *Mar. 28, 2006

(54) ADHESIVE FILM FOR UNDERFILL AND SEMICONDUCTOR DEVICE USING THE SAME

(75) Inventors: Akiko Matsumura, Ibaraki (JP); Kazuki Uwada, Ibaraki (JP); Naoki Sadayori, Ibaraki (JP); Yuji Hotta, Ibaraki (JP)

(73) Assignee: Nitto Denko Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/808,380

(22) Filed: Mar. 25, 2004

(65) Prior Publication Data

US 2004/0178423 A1    Sep. 16, 2004

(30) Foreign Application Priority Data

Mar. 26, 2003  (JP) ............................ P.2003-086353

(51) Int. Cl.
*B32B 27/00*    (2006.01)
*B32B 27/06*    (2006.01)

(52) U.S. Cl. ................ 428/473.5; 257/200; 428/411.1; 528/44; 528/51; 528/170

(58) Field of Classification Search ................ 528/170, 528/44, 51; 257/200; 428/411.1, 473.5
See application file for complete search history.

(56) References Cited

U.S. PATENT DOCUMENTS

| 3,929,733 A | 12/1975 | Alberino et al. |
| 4,060,664 A | 11/1977 | McGuire et al. |
| 4,721,768 A | 1/1988 | Cassidy et al. |
| 5,357,021 A | 10/1994 | Tye et al. |
| 6,090,906 A * | 7/2000 | Amano et al. ............... 528/170 |
| 6,492,484 B1 * | 12/2002 | Misumi et al. ............. 528/170 |
| 6,846,550 B1 * | 1/2005 | Matsumura et al. ........ 428/209 |

FOREIGN PATENT DOCUMENTS

| EP | 0 943 642 A1 | 9/1999 |
| JP | 51-61599 | 5/1796 |
| JP | 61-246245 A | 11/1986 |
| JP | 2-292316 A | 12/1990 |
| JP | 4-261428 A | 9/1992 |
| JP | 5-310877 A | 11/1993 |
| JP | 11-322888 A | 11/1999 |

OTHER PUBLICATIONS

European Search Report dated Jul. 28, 2004.

* cited by examiner

*Primary Examiner*—Terressa Boykin
(74) *Attorney, Agent, or Firm*—Sughrue Mion, PLLC

(57) ABSTRACT

An adhesive film for underfill excellent in relaxation effect of the stress generated in the above semiconductor element and the wiring circuit board and in the connecting electrode parts and also excellent in reliability of electrical connection between the semiconductor element and the wiring circuit board.

4 Claims, 2 Drawing Sheets

ADHESIVE FILM FOR UNDERFILL AND SEMICONDUCTOR DEVICE USING THE SAME

FIELD OF THE INVENTION

The present invention relates to an adhesive film for underfill, which is used for sealing at mounting a semiconductor element on a wiring circuit board such as a mother board or a daughter board in a facedown structure. In addition, the invention relates to a semiconductor device sealed using the adhesive film.

BACKGROUND OF THE INVENTION

In recent years, in order to further improve the performance of semiconductor devices, attention has been attracted to the methods for mounting a semiconductor element in a facedown structure on a wiring circuit board such as a mother board or a daughter board where a wiring circuit is formed (a flip-chip mode, a direct-chip mode, or the like). Namely, there arise various problems in view of performance in the conventional mounting methods. For example, when a semiconductor element is mounted on a wiring circuit board in a packaged form wherein contact is made from the element onto a lead frame with a gold wire, there sometimes occur delay of information communication caused by the wiring, information communication error induced by cross talk, and the like.

On the other hand, in the mounting method according to the facedown mode, the surface electrode of the semiconductor element is directly bonded to the wiring circuit board, so that it is possible to thin a semiconductor device and save its weight. However, in such a flip-chip mode, direct-chip mode, or the like, the semiconductor element and wiring circuit board which are different in linear expansion coefficient from each other are directly electrically connected. Thus, the reliability of the connection is an important problem.

For solving such a problem, a method for improving the reliability of the connection has been adopted wherein a liquid thermosetting resin called an underfill material is injected into the space between the semiconductor element and the wiring circuit board and then cured to form a resin cured article and thereby a stress converging to the electrically connected area is diverged to the resin cured article.

However, for injecting the liquid thermosetting resin between the semiconductor element and the wiring circuit board, it is necessary to provide a space for arranging an injection nozzle in the periphery of the mounting position of the semiconductor element. With the progress of miniaturization and thinning of the semiconductor device, it becomes difficult to reserve such a space for arranging the injection nozzle, so that it has been desired to improve the underfill process of the liquid resin.

The invention is achieved in consideration of such a situation and provides an adhesive film for underfill excellent in relaxation effect of the stress generated in the above semiconductor element and the wiring circuit board and in the connecting electrode parts and also excellent in reliability of the electrical connection between the semiconductor element and the wiring circuit board, and a semiconductor device using the same as a sealing resin layer.

SUMMARY OF THE INVENTION

The invention provides an adhesive film for underfill comprising a polycarbodiimide copolymer which comprises at least one structural unit selected from rubber residues represented by the following formulae (1) and (2) in a number "m":

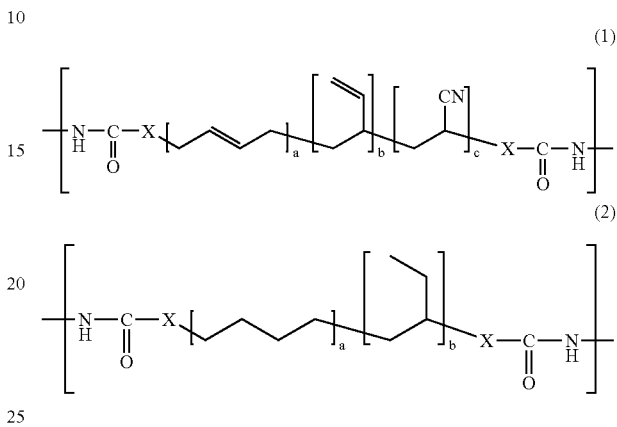

(wherein each of a, b and c is an integer of from 0 to 200, and X represents an alkylene group having from 0 to 5 carbon atoms) and a structural unit represented by the following formula (3) in a number "n":

(wherein R means an alkyl group having from 4 to 20 carbon atoms or an aryl group) and which comprises on each of the both termini a terminal structural unit derived from a monoisocyanate, wherein m is an integer of 2 or more, n is an integer of 1 or more, m+n is from 3 to 1,500 and m/(m+n) is from 1/1,500 to 1/3.

Furthermore, in a preferable adhesive film of the invention, the terminal structural unit of the polycarbodiimide copolymer is a substituted or unsubstituted aryl group (e.g., phenyl group, a naphthyl group), or an alkyl group having 1 to 10 carbon atoms.

BRIEF DESCRIPTION OF THE DRAWINGS

By way of example and to make the description more clear, reference is made to the accompanying drawing in which.

DESCRIPTION OF THE REFERENCE NUMERALS AND SIGNS

Figure 1:
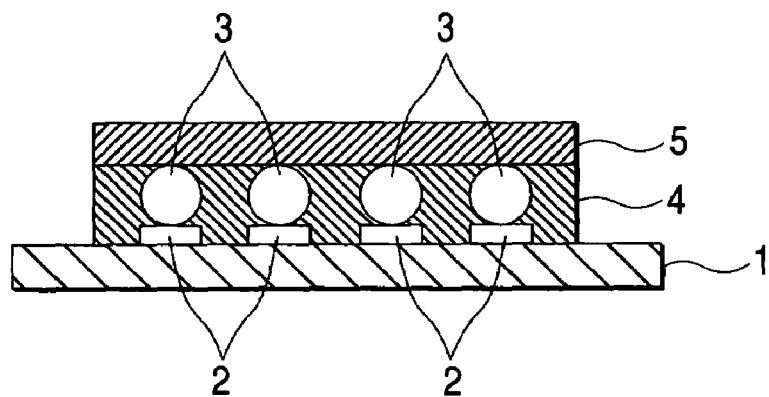
FIG. 1 is a schematic cross-sectional view illustrating one example of the semiconductor device of the invention.

1 Wiring circuit board
2 Connecting electrode parts
3 Connecting electrode parts
4 Sealing resin layer
5 Semiconductor element
6 Adhesive film for underfill
7 Semiconductor wafer

DETAILED DESCRIPTION OF THE INVENTION

The following will describe the invention in further detail.

In the present specification, "an alkylene group having 0 carbon atom" means a single bond (a direct bond).

The polycarbodiimide for use in the film for underfill according to the invention is a copolymer containing structural units (rubber residues) represented by the above formulae (1) and (2) and a repeating structural unit represented by the formula (3) in one molecule in a predetermined ratio. The polycarbodiimide has the structural units (rubber residues) represented by the above formulae (1) and (2) in the number of m and these structural units may be contained one kind or two or more kinds in one molecule. Moreover, the other repeating structural unit (isocyanate residue) of the formula (3) is contained in the number of n in one molecule. The above m is an integer of 2 or more and usually 1000 or less, and is preferably an integer of 2 to 10. Furthermore, n is an integer of 1 or more and usually 500 or less, and is preferably an integer of 1 to 10. In this connection, m+n is 3 to 1500, preferably 3 to 20 and m/(m+n) is 1/1500 to 1/3, preferably 1/11 to 1/3.

In the above formulae (1) and (2), the plural number of "a", "b" and "X" may be the same or different from each other, respectively.

As the terminal structural unit, a substituted or unsubstituted aryl group, or an alkyl group may be mentioned. As the unsubstituted aryl group, phenyl, naphthyl, or the like may be mentioned. As the aryl group having a substituent, tolyl, isopropylphenyl, methoxyphenyl, chlorophenyl, or the like may be mentioned as representatives. Moreover, as the alkyl group for the terminal structural unit, an alkyl group having 1 to 10 carbon atoms, such as n-butyl, n-hexyl, or n-octyl, may be mentioned.

(Production of Polycarbodiimide)

The above polycarbodiimide copolymer is obtained by reacting a bifunctional liquid rubber with an organic diisocyanate in an aprotic solvent and then treating the resulting product with an organic monoisocyanate for chain length control and a carbodiimidation catalyst.

(Bifunctional Liquid Rubber)

In the invention, as the bifunctional liquid rubber which introduces the repeating structural units of the formula (1) and/or the formula (2), for example, a liquid polybutadiene (the following formula (1); provided that c=0), a liquid polybutadiene-acrylonitrile copolymer (the following formula (1); provided that c≠0), or the like may be mentioned.

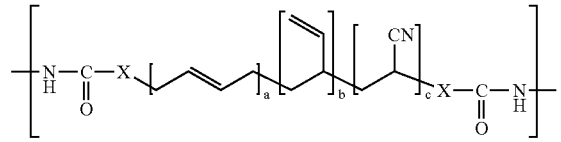

In addition, as the other bifunctional liquid rubber, a liquid hydrogenated polybutadiene (the following formula (2); provided that c=0) may be mentioned.

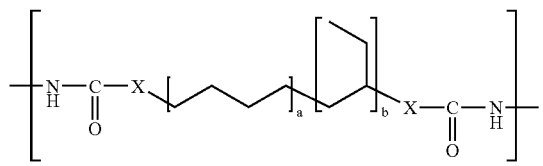

These may be used singly or as a mixture of two or more of them.

As commercially available products of the above liquid polybutadiene, for example, Hycar CTB (registered trademark) manufactured by Ube Industries, Ltd., Nippon Soda C-1000, and the like may be mentioned. Moreover, as the liquid polybutadiene-acrylonitrile copolymer, for example, Hycar CTBN (registered trademark) (e.g., CTBN1300X13, CTBN1300X8) manufactured by Ube Industries, Ltd. may be mentioned. Furthermore, as the liquid hydrogenated polybutadiene, for example, Nippon Soda CI-1000 and the like may be mentioned. These may be used after suitable modification.

(Organic Diisocyanate)

As the organic diisocyanate, aromatic and aliphatic diisocyanates can be used. These may be used singly or as a mixture of two or more of them. The amount of the organic diisocyanate to be used is 10 to 1000 mol, preferably 20 to 500 mol based on 100 mol of the above bifunctional liquid rubber.

(i) As the aromatic diisocyanates, those having a structure represented by the following formula (4) or (5) can be used.

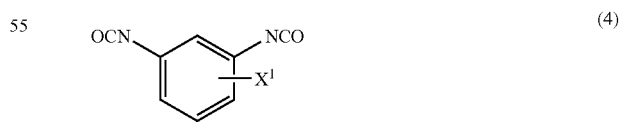

wherein $X^1$ represents an alkyl group having 1 to 5 carbon atoms, an alkoxyl group (preferably having from 1 to 2 carbon atoms), or a halogen.

Specific diisocyanates having a structure of the above formula (4) include m-phenylene diisocyanate, 2,4-tolylene diisocyanate, 2,6-tolylene diisocyanate, 6-methoxy-2,4-phe nylene diisocyanate, 5-bromo-2,4-tolylene diisocyanate, and the like.

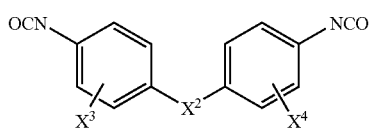

(5)

wherein $X^2$ represents an alkylene group having 0 to 5 carbon atoms, an oxy group, a sulfo group, or a sulfoxy group, and $X^3$ and $X^4$ each represents an alkyl group having 1 to 5 carbon atoms, an alkoxyl group (preferably having from 1 to 2 carbon atoms), or a halogen.

Specific diisocyanates having a structure of the above formula (5) include 4,4'-diphenylmethane diisocyanate, 3,3', 5,5'-tetraethyl-4,4'-diphenylmethane diisocyanate, 4,4'-diphenylisopropylidene diisocyanate, 4,4'-diphenyl ether diisocyanate, 4,4'-diphenyl sulfide diisocyanate, 4,4'-diphenyl sulfoxide diisocyanate, 3,3',5,5'-tetramethyl-4,4'-biphenyl diisocyanate, 3,3'-dimethoxy-4,4'-biphenyl diisocyanate, 3,3'-dibromo-4,4'-biphenyl diisocyanate, and the like.

(ii) Moreover, as the aliphatic organic diisocyanates, diisocyanates having a structure represented by the following formula (6), (7), or (8) can be used.

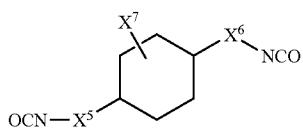

(6)

wherein $X^5$ and $X^6$ each represents an alkylene group having 0 to 5 carbon atoms, and $X^7$ represents an alkyl group having 1 to 5 carbon atoms or an alkylene group having 0 to 5 carbon atoms.

Specific diisocyanates having a structure of the above formula (6) include 4,4'-dicyclohexylmethane diisocyanate, norbornane diisocyanate, 4,4'-cyclohexane diisocyanate, isophorone diisocyanate, methylcyclohexane-2,4-diisocyanate, 2,4-bis(isocyanatomethyl)cyclohexane, and the like.

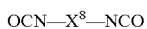

OCN—$X^8$—NCO (7)

wherein $X^8$ represents an alkylene group having 1 to 18 carbon atoms.

Specific diisocyanates having a structure of the above formula (7) include hexamethylene diisocyanate, 2,2,4-trimethylhexamethylene diisocyanate, 2,4,4-trimethylhexamethylene diisocyanate, octamethylene diisocyanate, and dodecamethylene diisocyanate.

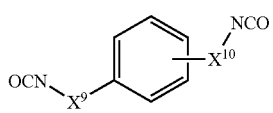

(8)

wherein $X^9$ and $X^{10}$ each represents an alkylene group having 0 to 5 carbon atoms.

Specific diisocyanates having a structure of the above formula (8) include xylylene diisocyanate, α,α,α',α'-tetramethylxylylene diisocyanate, and 4-isocyanatomethyl-phenylisocyanate.

(Monoisocyanate)

Examples of the monoisocyanate to be used for chain length control of the aimed copolymer include isocyantates having a substituted or unsubstituted aryl group, such as phenyl isocyanate, naphthyl isocyanate, tolyl isocyanate, isopropylphenyl isocyanate, methoxyphenyl isocyanate, and chlorophenyl isocyanate; or alkyl isocyanates having 1 to 10 carbon atoms, such as n-butyl isocyanate, n-hexyl isocyanate, and n-octyl isocyanate.

The monoisocyanate is preferably used in an amount of 1 to 10 mol based on 100 mol of the diisocyanate component. The use of a smaller amount of the monoisocyanate than the above amount may result in too large molecular weight of the resulting polycarbodiimide, may induce increase in the viscosity of the solution or solidification of the solution by a crosslinking reaction, and may cause a remarkable decrease of storage stability of the polycarbodiimide solution. On the other hand, when the amount of the monoisocyanate to be used is larger than the above amount, the solution viscosity of the resulting polycarbodiimide solution may be too low to form a satisfactory film in the film formation by applying and drying the solution.

(Catalyst)

As the catalyst to be used for polymerization, various catalysts may be used and preferred are 3-methyl-1-phenyl-2-phospholene-1-oxide, 1-phenyl-2-phospholene-1-oxide, 1-phenyl-2-phospholene-1-sulfide, 1-ethyl-3-methyl-2-phospholene-1-oxide, 3-methyl-1-phenyl-1-phospha-3-cyclopentene- 1-oxide, 2,5-dihydro-3-methyl-1-phenylphosphole-1-oxide, and isomers corresponding to them, 3-phospholenes. Moreover, phosphine oxides such as triphenylphosphine oxide, tritolylphosphine oxide, and bis(oxadiphenylphosphino)ethane can be used.

The amount of the catalyst is 0.001 to 5 mol % based on the total amount of the isocyanate components to be used. When the amount to be used is smaller than the range, it may take too much time to effect the polymerization and hence the case is unpractical. On the other hand, when the amount exceeds the range, the reaction may be too fast, so that the product may solidify into a gel form during the reaction or its storage stability may remarkably decrease.

(Polymerization Reaction)

The polycarbodiimide copolymer of the invention is obtained by carrying out the polymerization of a linear liquid rubber having a carboxyl group at each of both ends with a diisocyanate in the presence of a carbodiimidation catalyst in an aprotic organic solvent at 10 to 150° C., preferably 60 to 110° C. When the polymerization temperature exceeds the above range, the reaction is too fast, the product may solidify into a gel form during the reaction owing to the occurrence of a side reaction, or its storage stability may remarkably decrease. When the reaction temperature at the polymerization is lower than the above temperature range, the reaction may proceed too slow or the stability of the solution may decrease owing to remaining isocyanate functional groups in the polycarbodiimide copolymer solution, and hence the case is not preferable.

The time of reaction is not particularly limited and may be appropriately decided by monitering the decrease in the N—C—O stretching vibration of the isocyanate and increase in the N—C—N stretching vibration of the carbodiimide. The time of reaction is generally from 30 min. to 150 min., preferably from 40 min. to 120 min., most preferably from 60 min. to 90 min.

The polycarbodiimide copolymer of the invention can be obtained as its solution by effecting the carbodiimidation in an aprotic organic solvent. Such aprotic organic solvents include toluene, xylene, alkyltoluene having from 3 to 5 carbon atoms in the alkyl moiety thereof, benzene, alkylbenzene having from 3 to 36 carbon atoms in the alkyl moiety thereof, naphthalene, tetrahydrofuran, dioxane, acetone, butanone, cyclohexanone, N-methylpyrrolidone, N,N-dimethylformamide, N,N-dimethylacetamide, and the like. These solvents may be used singly or as a mixture of two or more of them. Moreover, a component that does not participate in the reaction may be co-present.

These solvents may be used so that the concentration of the polycarbodiimide copolymer in the polymer solution becomes 1 to 90% by weight based on the total weight of the polymer solution. When the concentration of the polymer solid matter exceeds 90% by weight, the viscosity may become high and also the storage stability of the solution may decrease. When the concentration is less than 1% by weight, it is necessary to remove a large amount of the solvent at molding of the resulting polymer and hence the case is unpractical.

In the typical method for production according to the invention, 70 parts by weight of a liquid rubber component, 30 parts by weight of tolylene diisocyanate, and 2 molar parts of 1-naphthyl isocyanate relative to tolylene diisocyanate are mixed and the mixture was stirred at 50° C. for 1 hour, followed by the addition of a carbodiimidation catalyst into the mixture. Under confirming the progress of the reaction by infrared spectroscopy, the temperature is elevated to 100° C. and carbodiimidation is carried out at this temperature for 2 hours.

(Production of Adhesive Film)

For producing an adhesive film for underfill according to the invention, the above polycarbodiimide copolymer varnish is transformed into a film having an appropriate thickness using a known method (casting, spin-coating, roll-coating, etc.). The formed film is usually dried at a temperature necessary to remove the solvent. Namely, so as to dry the film without too much progress of curing, the applying temperature is set at for example 20 to 350° C., preferably 50 to 250° C., most preferably 70 to 200° C. When the drying temperature is lower than this range, the solvent remains in the film, so that the reliability of the film decreases and the case is not preferable. When the drying temperature is higher than the above range, thermal curing of the film tends to proceed.

At the production of the adhesive film, a fine inorganic filler may be mixed within the range where its processability and thermal property are not impaired. Moreover, for imparting a surface smoothness, various additives such as a smoothing agent, a leveling agent, and a deforming agent may be added, if necessary. The mixing amount of these additives is 0.1 to 100 parts by weight, preferably 0.2 to 50 parts by weight based on 100 parts by weight of the copolymer.

Moreover, for improving the adhesiveness, various additives such as a silane-coupling agent, a titanium-based coupling agent, a nonionic surfactant, a fluorine-based surfactant, and a silicone-based additive may be added, if necessary.

At the production of the adhesive film, for improving thermal conductivity and controlling elastic modulus, one or two or more kinds of various inorganic powders composed of metals or alloys such as aluminum, copper, silver, gold, nickel, chromium, lead, tin, zinc, palladium, and solder, ceramics such as alumina, silica, magnesia, and silicon nitride, carbon, and the like may be mixed, if necessary.

Furthermore, it is possible to form a laminated adhesive sheet where the film is provided on a support. For producing such a laminated adhesive sheet, the varnish of the above polycarbodiimide may be applied on a support or a film is formed beforehand and the film may be laminated on a support by pressing or the like.

As the support to be used therein, a metal foil or a insulating film may be mentioned. As the metal foil, any of aluminum, copper, silver, gold, nickel, indium, chromium, lead, tin, zinc, palladium, and the like may be used and these metals may be used singly or as an alloy. As the insulating film, any of films having thermal resistance and chemical resistance, such as films made of polyimides, polyesters, and polyethylene terephthalate, can be used.

The above metal foil and insulating film each may be used singly or a two-layer material obtained by laminating both, such as a metal foil/insulating film, may be used. Examples of the two-layer material include a copper/polyimide two-layer material.

The adhesive film for underfill thus obtained can be cured at sealing operation, for example, as follows. Namely, a semiconductor device can be sealed by heating the sheet-shape sealing material obtained by the above method at 100 to 225° C., preferably 120 to 200° C. for 3 to 300 minutes, preferably 5 to 180 minutes to effect curing.

The following will describe one specific example of the sealing method of a semiconductor device using the adhesive film for underfill according to the invention, but the semiconductor device of the invention is not limited thereto.

Figure 2:
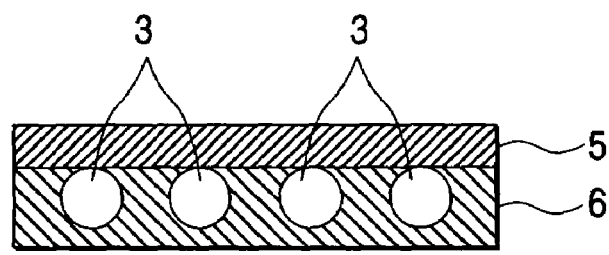
FIG. 2 is a schematic cross-sectional view illustrating one example of the production process of the semiconductor device shown in FIG. 1.
Figure 3:
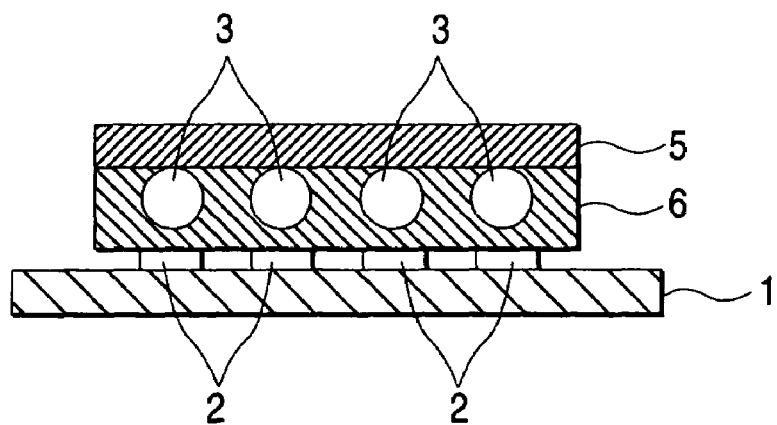
FIG. 3 is a schematic cross-sectional view illustrating one example of the production process of the semiconductor device shown in FIG. 1.
Figure 4:
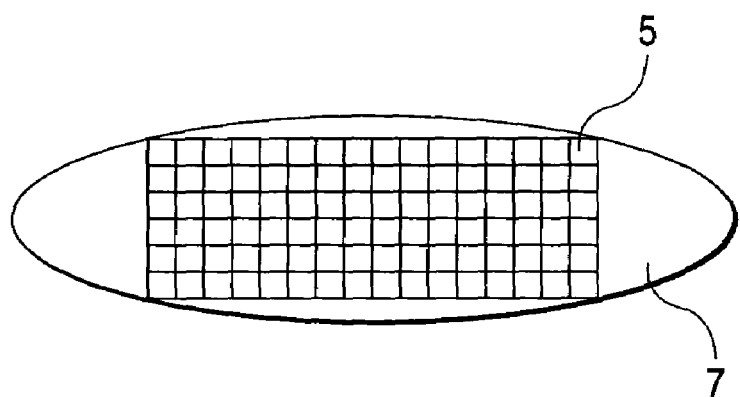
FIG. 4 is a schematic view illustrating plurality of semiconductor elements formed on a semiconductor wafer.

A semiconductor element 5 to which an adhesive film for underfill 6 had been attached as shown in FIG. 2 is arranged to a predetermined position on a wiring circuit board 1 where connecting electrode parts 2 have been provided (see FIG. 3). Then, this is heated and pressed to melt and extrude the adhesive film for underfill 6 between both connecting electrode parts 2 and 3, and thereby the electrode parts 2 and 3 are brought into contact with each other and electrically connected. At the same time, the melted adhesive film for underfill 6 is cured to form a sealing resin layer 4 and thereby the electrical connection and fixing of the wiring circuit board 1 to the semiconductor element 5 are effected.

Thus, as shown in FIG. 1, a semiconductor device having a facedown structure is obtained wherein the semiconductor element is mounted on the wiring circuit board through connecting electrode parts provided on the wiring circuit board and connecting electrode parts provided in the semiconductor element and wherein the space between the wiring circuit board and the semiconductor element is sealed with the sealing resin layer of the adhesive film. In this connection, the attachment of the above adhesive film for underfill 6 to the semiconductor element 5 may be carried out before the semiconductor element 5 is carved up from a semiconductor wafer 7 or may be carried out after the carving.

Figure 5:
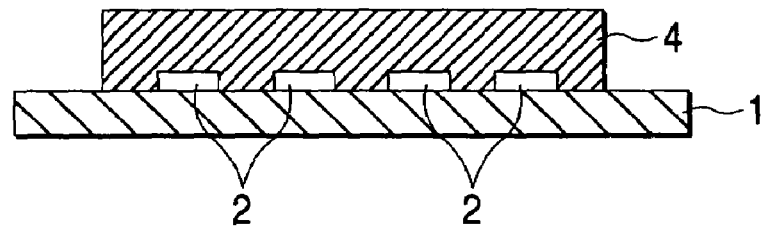
FIG. 5 is a schematic cross-sectional view illustrating the other example of the production process of the semiconductor device shown in FIG. 1.

Furthermore, contrary to the above method, the sealing may be carried out after placing the adhesive film for underfill 6, through connecting electrode parts 2, on the wiring circuit board 1 equipped with plurality of connecting electrode parts 2 as shown in FIG. 5. At predetermined positions on such wiring circuit board, the semiconductor element 5 equipped with the connection electrodes 3 is arranged. Then, the whole is heated and pressed to heat-melt and extrude the adhesive film between both connecting electrode parts 2 and 3 and thereby electrical connection is effected. At the same time, the melted adhesive film for underfill 6 is cured to form a sealing resin layer 4 and thereby the electrical connection and fixing of the wiring circuit board 1 to the semiconductor element 5 are effected. The semiconductor device shown in FIG. 1 may be produced also by this method.

The size of the adhesive film for underfill 6 may be suitably determined depending on the size (area) of the semiconductor element 5 to be mounted but usually, it is preferable to determine the size about the same as the size (area) of the semiconductor element 5.

The thickness of the adhesive film for underfill is not particularly limited. The thickness may be suitably determined in the range so as to fill the space between the semiconductor element and the wiring circuit board and so as not to inhibit the electrical connection between the connecting electrode parts, and is usually 5 to 200 μm, preferably 10 to 120 μm.

At the filling of the space between the semiconductor element and the wiring circuit board with the adhesive film for underfill, it is preferable to press the film. The conditions for the pressing may be suitably determined depending on the material and number of the connecting electrode parts 2 and 3, and the temperature, but may be determined in the range of generally 0.098 to 4.9 N/part, preferably 0.196 to 2.94 N/part.

In the above production method for the semiconductor device, it has been described based on the positional relationship wherein the wiring circuit board 1 is placed at the lower part and the semiconductor element 5 is mounted above it, but the production method is not limited thereto and the reverse positional relationship may be possible wherein the semiconductor element 5 is place at the lower part and the wiring circuit board 1 is mounted above it.

The following will describe the invention more specifically with reference to Examples and Comparative Examples. All the production of polymers was carried out under a nitrogen stream. The physical properties of the resulting polycarbodiimides were measured as follows.

IR

It was measured using FT/IR-230 (manufactured by JEOL).

Tensile Elastic Modulus (E')

It was measured using a dynamic viscoelasticity apparatus DMS210 (manufactured by K.K. Seiko Denshi Kogyo). The measurement was carried out on an adhesive film for underfill cured at 175° C. for 5 hours.

Glass Transition Temperature (Tg)

It was measured using a thermomechanical analysis apparatus TMA SS/100 (manufactured by K.K. Seiko Denshi Kogyo). The measurement was carried out on an adhesive film for underfill cured at 175° C. for 5 hours.

EXAMPLE 1

42.5 g (244 mmol) of TDI (a mixture of 80% of 2,4-TDI and 20% of 2,6-TDI), 61.1 g (244 mmol) of 4,4'-diphenylmethane diisocyanate, 48.7 g of CTBN1300X13 (Ube Industries, Ltd.), and 226 g of toluene were mixed. The mixture was maintained at 40° C. for 1 hour under stirring. After the progress of the reaction was confirmed by IR spectroscopy, 8.3 g (49 mmol) of 1-naphthyl isocyanate and 1.88 g (9.7 mmol) of 3-methyl-1-phenyl-2-phospholene-1-oxide were added thereto and then the temperature of the reaction mixture was elevated to 80° C. The progress of the reaction was confirmed by IR spectroscopy. Specifically, the decrease of the absorption of the N—C—O stretching vibration (2270 cm$^{-1}$) of isocyanate and the increase of the absorption of the N—C—N stretching vibration (2135 cm$^{-1}$) of carbodiimide were observed. The resulting polycarbodiimide solution was added dropwise to 1 L of heptane under stirring and the formed precipitate was collected and dried to obtain 122 g of a polymer.

The resulting polycarbodiimide solution was subjected to the conditions of a reduced pressure of 10 mmHg, 80° C., and 1 hour to remove the solvent, toluene, and the remaining solid matter was hydrolyzed with an aqueous potassium hydroxide solution by the method described in J. Appl. Polym. Sci. 14, 35 (1970), followed by extraction with ether. The ether phase was analyzed using a gas chromatograph-mass spectrometer (GC-MS) to determine triethylenediamine and 4,4'-diphenylmethanediamine quantitatively. For the quantitative determination, a calibration curve was prepared using each standard sample. Thereby, it was confirmed that the content of triethylenediamine and 4,4'-diphenylmethanediamine was in the ratio of 50:50 and the weight fraction of the structures derived from individual diamines was 68%. Accordingly, it was confirmed that the ratio of the structural units m/m+n was 1/45.4. Based on this ratio and the fact that the weight average molecular weight obtained by analyzing the polycarbodiimide solution on GPC was $1.3 \times 10^4$, it was confirmed that m+n was 53.8.

The resulting varnish was applied on a separator (thickness 50 μm) made of a polyethylene terephthalate film treated with a releasing agent using a laminator (applying rate 1 m/minute, drying temperature 130° C.×1 minute→150° C.×1 minute) to obtain an adhesive film for underfill (thickness of the adhesive film 40 μm). Its glass transition temperature Tg was found to be 232° C. and its tensile elastic modulus E' (35° C.) was found to be 460 Mpa.

Using the thus obtained adhesive film for underfill, a semiconductor device was produced according to the above method for producing the semiconductor device. Namely, as shown in FIG. 2, the above adhesive film 6 was attached onto the semiconductor element 5 (thickness: 150 μm, size: 8 mm×8 mm) equipped with connecting electrode parts 3 (material: Au stud bump, height: 50 μm, 91 bump/chip, peripheral) at ordinary temperature (25° C.) and then, as shown in FIG. 3, a wiring circuit board 1 (flexible printed circuit board having a thickness of 40 mm) equipped with Cu wiring (L/S=100 μm/100 μm, height 18 μm, subjected to electroless Ni/Au plating) was placed in the predetermined position on the above adhesive film 6. Thereafter, using an ultrasonic flip chip bonder (Nippon Avionics Co., Ltd., NAW-1260A), the adhesive film was heat-melted under the conditions of heating temperature (tool 150° C., stage 80° C.)×load 4.5 kgf/number of the electrodes×0.5 s, oscillation frequency of 40 kHz to fill the space between the wiring circuit board 1 and the semiconductor element 5 with the resin in a melted state, whereby they were tentatively fixed and also the above both connecting electrode parts 2 and 3 were brought into contact with each other and metallically jointed. Then, by thermal curing (175° C.×5 hours), 10 pieces of a semiconductor device sealed with the underfill sealing resin layer 4 as shown in FIG. 1 were produced.

COMPARATIVE EXAMPLE 1

36.9 g (158.25 mmol) of 4,4'-diphenylmethane diisocyanate (Cosmonate PH manufactured by Mitsui Takeda Chemicals, Inc.), 11.09 g (52.75 mmol) of naphthalene diisocyanate, and 340.2 g of toluene were mixed. After this mixture was stirred at 50° C. for 1 hour, 3.57 g (21.1 mmol) of 1-naphthyl isocyanate and 0.41 g (2.11 mmol) of 3-methyl-1-phenyl-2-phospholene-2-oxide were added thereto and the temperature was elevated to 100° C. under stirring, followed by maintenance for further 2 hours. The progress of the reaction was confirmed by IR spectroscopy. Specifically, the decrease of the absorption of the N—C—O stretching vibration (2270 cm$^{-1}$) of isocyanate and the increase of the absorption of the N—C—N stretching vibration (2135 cm$^{-1}$) of carbodiimide are observed. Also, the absorption of the C—O stretching vibration (1695 cm$^{-1}$) of the amide group at the bonding area was observed.

An adhesive film for underfill was obtained in the same manner as in Example 1 with the exception that this varnish was used. Its glass transition temperature Tg was found to be 212° C. and its tensile elastic modulus E' (35° C.) was found to be 2320 Mpa. The production method of a semiconductor device was also the same as the Example. However, the adhesive film 6 was attached to the semiconductor element 5 at 90° C.

(Conducting Test)

On the semiconductor devices obtained in the Example and the Comparative Example, an initial conducting test was carried out at 25° C. Furthermore, using the semiconductor devices which were conductive, a thermal cycle test (TCT (conditions: −55° C.×30 minutes ↔ 125° C.×30 minutes, 1000 cycles)) was carried out. The results were shown in the following Table 1.

TABLE 1

|  | Example | Comparative Example |
|---|---|---|
| Tensile elastic modulus (MPa) | 460 | 2320 |
| Grass transition temperature Tg (° C.) | 232 | 212 |
| Temperature for attaching adhesive film to semiconductor element | Ordinary temperature | 90° C. |
| Initial conduction test (number of defectives/10 pieces) | 0/10 | 0/10 |
| TCT (1000 cycles) | | |
| (1) Number of defectives/10 pieces | 0/10 | 10/10 |
| (2) Cycle at which defective occurs | — | 200 |

From the results in Table 1, with regard to the semiconductor device obtained in the Example, it was confirmed that no defective occurred in the thermal cycle test and a good connection was obtained. On the other hand, with regard to the semiconductor device of the Comparative Example, an insufficient connection occurred within short cycles. Therefore, it is evident that a satisfactory connection reliability of the semiconductor device is obtained by using the adhesive film of the invention having a high thermal resistance and a low elastic modulus.

The adhesive film of the invention maintains a high thermal resistance and also have a low elastic modulus. The use of the adhesive film as a sealing resin layer between the wiring circuit board and the semiconductor element of a semiconductor device connected through plurality of connecting electrode parts can relax the stress generated in the wiring circuit board, the semiconductor element, and the connecting electrode parts. Therefore, a warp of the wiring circuit board and the semiconductor element is reduced, crack generation in the semiconductor element is prevented, and electrical connection between the connecting electrode parts provided on the wiring circuit board and the connecting electrode parts provided on the semiconductor element is improved.

While the invention has been described in detail and with reference to specific embodiments thereof, it will be apparent to one skilled in the art that various changes and modifications can be made therein without departing from the scope thereof.

This application is based on Japanese patent application No. 2003-086353 filed Mar. 26, 2003, the entire contents thereof being hereby incorporated by reference.

What is claimed is:

1. An adhesive film for underfill comprising a polycarbodiimide copolymer which comprises at least one structural unit selected from rubber residues represented by the following formulae (1) and (2) in a number "m":

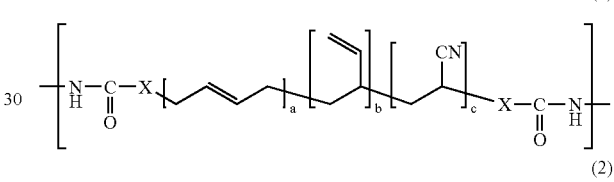

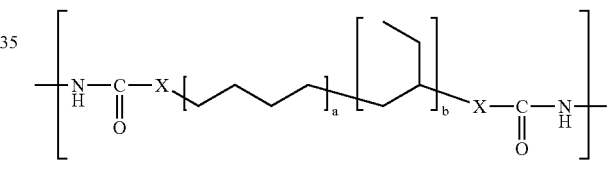

(wherein each of a, b and c is an integer of from 0 to 200, and X represents an alkylene group having from 0 to 5 carbon atoms) and a structural unit represented by the following formula (3) in a number "n":

(wherein R means an alkyl group having from 4 to 20 carbon atoms or an aryl group) and which comprises on each of the both termini a terminal structural unit derived from a monoisocyanate, wherein m is an integer of 2 or more, n is an integer of 1 or more, m+n is from 3 to 1,500 and m/(m+n) is from 1/1,500 to 1/3.

2. The adhesive film for underfill according to claim 1, wherein the terminal structural unit of the polycarbodiimide copolymer is a substituted or unsubstituted aryl group, or an alkyl group having 1 to 10 carbon atoms.

3. A semiconductor device wherein the space between a semiconductor element and a wiring circuit board is sealed with the adhesive film for underfill according to claim 1.

4. A semiconductor device wherein the space between a semiconductor element and a wiring circuit board is sealed with the adhesive film for underfill according to claim 2.

* * * * *